US009716385B2

(12) United States Patent
Dickey

(10) Patent No.: US 9,716,385 B2
(45) Date of Patent: Jul. 25, 2017

(54) SOLID STTE POWER CONTROLLER WITH PARALLEL MOSFET LOAD SHARING

(71) Applicant: Hamilton Sundstrand Corporation, Windsor Locks, CT (US)

(72) Inventor: John A. Dickey, Caledonia, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 423 days.

(21) Appl. No.: 14/305,690

(22) Filed: Jun. 16, 2014

(65) Prior Publication Data

US 2015/0364922 A1 Dec. 17, 2015

(51) Int. Cl.

| | |
|---|---|
| ***H01H 31/10*** | (2006.01) |
| ***H02J 4/00*** | (2006.01) |
| ***H03K 3/01*** | (2006.01) |
| ***H03K 17/082*** | (2006.01) |
| ***H03K 17/12*** | (2006.01) |
| ***H03K 17/16*** | (2006.01) |

(52) U.S. Cl.

CPC .................. *H02J 4/00* (2013.01); *H03K 3/01* (2013.01); *H03K 17/0822* (2013.01); *H03K 17/122* (2013.01); *H03K 17/166* (2013.01); *H03K 2217/0036* (2013.01); *Y10T 307/76* (2015.04)

(58) Field of Classification Search

CPC .......................................................... H02J 4/00

See application file for complete search history.

(56) References Cited

U.S. PATENT DOCUMENTS

| | | | | |
|---|---|---|---|---|
| 5,221,909 A * | 6/1993 | Cole | H01Q 25/02 330/253 |
| 6,181,190 B1 * | 1/2001 | Wiklund | H03K 17/6874 326/27 |
| 6,504,730 B1 | 1/2003 | Cooney et al. | |
| 6,768,350 B1 | 7/2004 | Dickey | |

(Continued)

FOREIGN PATENT DOCUMENTS

JP 06252741 A * 9/1994

OTHER PUBLICATIONS

European Search Report, EP Application No. 15172044.8-1805, dated Nov. 11, 2015, 8 pages.

(Continued)

*Primary Examiner* — Daniel Cavallari

(74) *Attorney, Agent, or Firm* — Kinney & Lange, P.A.

(57) ABSTRACT

A solid state power control (SSPC) controls flow of current from a power bus to an inductive load. The SSPC utilizes load sharing, in which a plurality of current supply paths are connected in parallel to control and share the flow of current between the power bus and the inductive load. Each current supply path includes a main power switching field effect transistor (FET); a balance resistor, and a secondary FET. The balance resistor is connected between the main FET and the load. The secondary FET shunts the balance resistor when the main FET is turned on, and allows current flow through the balance resistor during a turn-off time of the main FET. The balance resistor modulates gate-source voltage of the main FET in order to compensate for gate-source threshold differences among the main FETs that could lead to unequal current sharing during the turn-off period.

19 Claims, 3 Drawing Sheets

(56) References Cited

U.S. PATENT DOCUMENTS

| | | | | |
|---|---|---|---|---|
| 6,812,735 | B1 * | 11/2004 | Pham ............... | H03K 17/04106 326/24 |
| 6,856,045 | B1 | 2/2005 | Beneditz et al. | |
| 7,626,797 | B2 | 12/2009 | Kilroy et al. | |
| 7,656,634 | B2 | 2/2010 | Robertson et al. | |
| 7,741,737 | B2 | 6/2010 | Kilroy | |
| 8,344,544 | B2 | 1/2013 | Rozman et al. | |
| 8,547,675 | B2 | 10/2013 | Maier | |
| 8,847,656 | B1 * | 9/2014 | A ..................... | H03K 17/08122 327/310 |
| 2003/0016520 | A1 | 1/2003 | Cooney et al. | |
| 2006/0044028 | A1 | 3/2006 | Bhattacharya et al. | |
| 2007/0268726 | A1 | 11/2007 | Kojori et al. | |
| 2009/0295551 | A1 | 12/2009 | Dickey | |
| 2011/0222200 | A1 | 9/2011 | Fuller et al. | |
| 2013/0154717 | A1 | 6/2013 | Tyler et al. | |
| 2013/0252473 | A1 | 9/2013 | Dickey et al. | |
| 2014/0103990 | A1 | 4/2014 | Holley et al. | |
| 2014/0266150 | A1 * | 9/2014 | Thornton ............. | G01N 33/206 324/71.1 |

OTHER PUBLICATIONS

Abdi B. et al., "Problems Associated with Parallel Performance of High Current Semiconductor Switches and their Remedy", Speedam 2008, International Symposium on Power Electronics, Electrical Devices, Automation and Motion, Jun. 11, 2008, pp. 1379-1383.

Matsui K. et al., "A Pulsewidtch-Modulated Inverter with Parallel Connected Transistors Using Current-Sharing Reactors", IEEE Transactions on Power Electronics, vol. 8, No. 2, Apr. 1993, pp. 186-191.

Bortis D. et al., "Active Gate Control for Current Balancing of Parallel-Connected IGBT Modules in Solid-State Modulators", IEEE Transactions on Plasma Science, vol. 36, No. 5, Oct. 2008, pp. 2632-2637.

* cited by examiner

SOLID STTE POWER CONTROLLER WITH PARALLEL MOSFET LOAD SHARING

BACKGROUND

Solid state power controllers (SSPCs) are used as an alternative to mechanical relays and circuit breakers to distribute power and protect loads. SSPCs have found use, for example, in the power distribution within aircraft. An SSPC typically makes use of one or more solid state switching devices to provide on and off control of the power delivered from a power bus to a load. The solid state switching devices used in SSPCs are typically field effect transistors (FETs), and more particularly metal oxide semiconductor field effect transistors (MOSFETs).

There has been a trend toward using SSPCs with increasingly large loads. The increased current carrying capacity needed to control larger loads has been addressed by current sharing using multiple current paths, with each path containing a MOSFET to control flow of the current. The number of parallel current paths used by the SSPC may vary from a few to many.

MOSFET based SSPCs normally operate the MOSFET in the fully-ON saturated state where only the drain-source ON resistance (Rds-ON) affects the voltage drop and power dissipation in the MOSFET. In this state, multiple MOSFETs in parallel current paths can share a load effectively; and since the MOSFETs are saturated when ON, the total power dissipation in the ON state is relatively low.

However, during turn-off of an inductive load, the MOSFETs have to spend some time in the linear operating region with both substantial current flowing through the MOSFETs and at a substantial voltage drop between drain and source until the energy stored in the inductive load has been dissipated. During the turn-off period, if one of the MOSFETs carries a substantially larger share of the total current than other MOSFETs in the other parallel current paths the MOSFET carrying a larger share of the current could be exposed to very high peak power dissipation levels and as a result could be damaged. The most common cause of this imbalance in sharing is differences between the devices in the Gate threshold voltage.

SUMMARY

A solid state power controller (SSPC) controls flows of current from a power bus to a load which can be inductive. The SSPC includes a plurality of current supply paths connected in parallel to control flow between the power bus and the inductive load and a controller provides signals to turn-on and turn-off flow of current to the inductive load. Each current supply path includes a main power switching field effect transistor (FET) and a balance circuit formed by a balance resistor, and a secondary FET. The secondary FET shunts the balance resistor when the main power switching FET and the secondary FET are turned on. The secondary FET allows current flow through the balance resistor during a turn-off time of the main power switching FET.

A method of controlling current flow from a power bus to an inductive load supplies current through a plurality of parallel current supply paths. When current through the inductive load needs to be turned off, a turn-off signal is provided to a main power switching FET in each of the current supply paths. In response to the turn-off signal, a balance resistor is introduced into each of the current supply paths. Each balance resistor modulates gate-source voltage of the main power switching FET in its respective current supply path as a function of current flow through the balance resistor.

DETAILED DESCRIPTION

Figure 1:
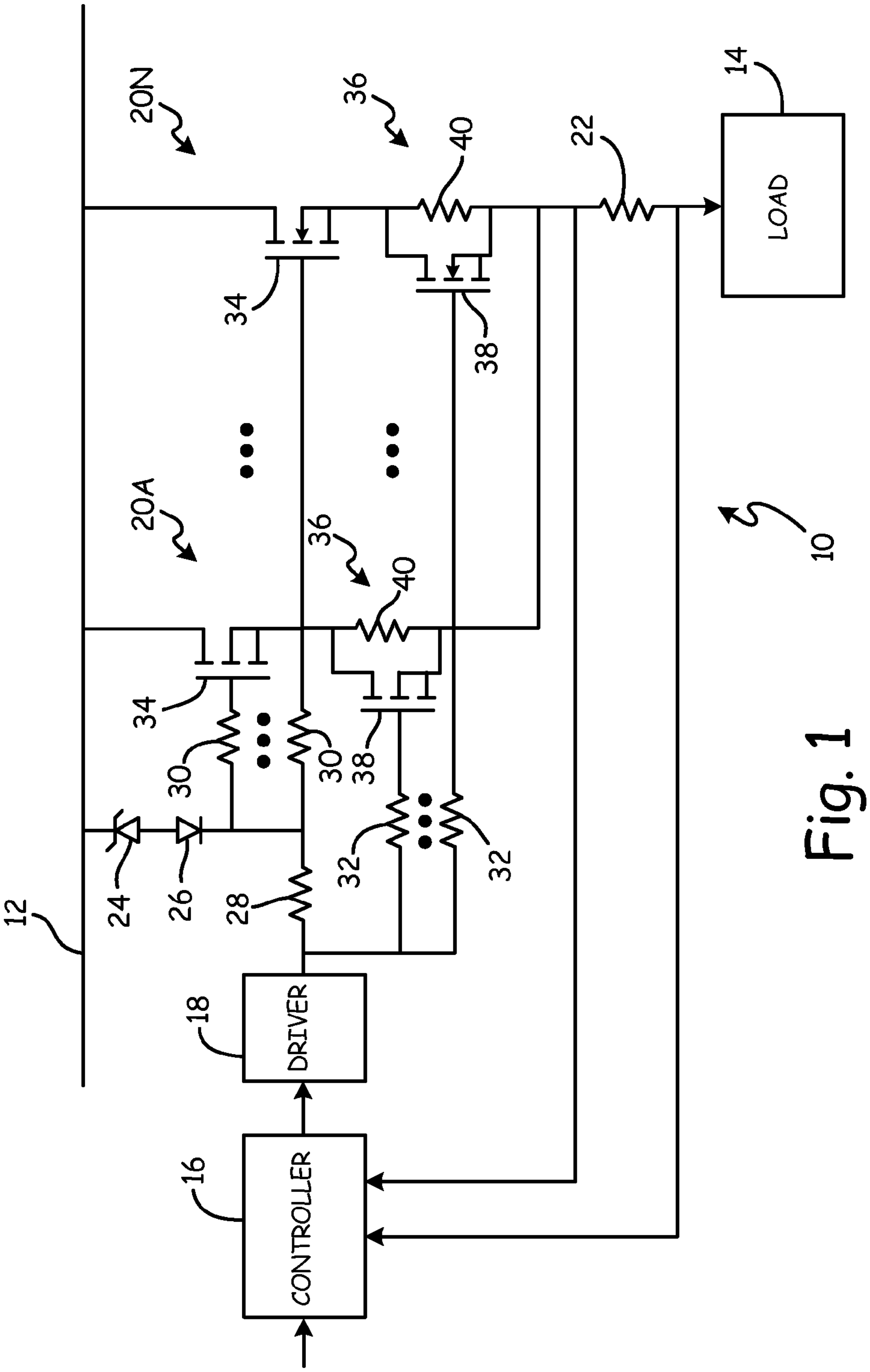
FIG. 1 is a schematic diagram of a solid state power controller that provides current balancing in a plurality of parallel current supply paths during the turn-off of power to an inductive load.

With small SSPCs, only one or a small number of MOSFETs in parallel are needed to carry current to a load, to handle fault handling energy, and to handle dissipation of inductively stored energy on a load or a bus. The need for larger SSPCs has resulted in the use of a larger number of MOSFETs in parallel to provide the necessary current carrying capacity. The use of many MOSFETs connected in parallel is premised on the MOSFETs in the parallel current paths sharing current evenly when they are turned on and also sharing current evenly when dissipating inductive stored energy from the load when the SSPC opens a circuit to turn off current to the load. In practice, however, variances in MOSFETs can occur, so that one of the MOSFETs carries a larger portion of the dissipation energy during turn-off. If one of the MOSFETs carries substantially more of the current than others during turn-off, it can be exposed to very high peak power dissipation levels and can be damaged.

The main reason one MOSFET may carry more current than others in an SSPC with parallel current supply paths is that the gate-to-source threshold voltage of a MOSFET varies from part-to-part and is also a function of temperature. If the MOSFETs being used in the SSPC are not all from the same die lot, they may have different gate-to-source threshold voltages. In some cases, different MOSFETs are not exposed to the same temperature during operation, which can also result in a shift of gate-to-source threshold of one MOSFET with respect to others. If one MOSFET has a much lower gate-to-source threshold voltage, then it will carry much more current than others during turn off.

When a fault is sensed or a command has been received to turn-off power to the load, the controller of the SSPC will provide the signal to the MOSFETs in the parallel current supply paths to cause them to turn off. Prior to the turn-off signal, the FETs will all be turned on and operating in fully-ON saturated state so that the voltage drop across the MOSFET will be based on the drain-to-source resistance in the on state (Rds-ON). Current flows between the power bus and the load through the turned-on saturated MOSFETs. With an inductive load, the current flowing through the load produces magnetic flux that stores energy. When the SSPC attempts to the open the load, the inductance of the inductive load tries to continue the current flow. This results in a voltage reversal across the load which causes current flow to continue until the energy in the flux storage has collapsed.

As the MOSFETs attempt to turn-off, they transition from the saturated ON operating state to the linear operating region in which both substantial current can flow through the MOSFETs and substantial voltage drop can occur across the drain-to-source. The MOSFET remains turned on because the reversal of voltage across the load will appear at the source of the MOSFET and can produce a gate-to-source voltage difference that is greater than the gate-to-source threshold voltage of the MOSFET.

If one MOSFET has a much lower threshold voltage, then it will carry much more current than the other MOSFETs located in the other current carrying paths. The total current will be split among the current carrying paths depending upon the resistance in each current path. If one MOSFET has a much lower threshold voltage, then it will carry much more current than the other MOSFETs as the load voltage starts to drop below the drive voltage. The lowest threshold MOSFET starts to conduct first and has to carry enough current to result in adequate gate-to-source voltage for other MOSFETs to turn-on as well. Since the gate voltage-to-drain current slope is very flat, this results in a wide separation between the currents carried by the MOSFETs with different gate-to-source threshold voltages.

The present invention reduces the difference in current drawn by MOSFETs with different gate-to-source threshold voltages by effectively changing the slope of the current-to-voltage ratio so that as the current in the MOSFET increases, the voltage drop from the bus to the load increases faster than it would with just the MOSFET ON resistance. This more quickly brings the gate voltage of other MOSFETs to the point where they will also conduct part of the current.

This present invention is accomplished by placing a small balance resistor in series with the drain of each MOSFET only during the turn-off time. This is controlled by having a low voltage ultra-low ON resistance MOSFET short the small balance resistor when the channel is fully on and only turn off when the channel turns off.

The small balance resistor in series with each main switching FET could stay there except for the extra steady state voltage drop and power dissipation when carrying a load so the low ON resistance FET acts as a shunt during normal operation to keep the total power dissipation and voltage drop low.

Another way to describe how the balance resistor helps to balance the turn-off current is that as the current through an individual resistor increases and its voltage drop increases, it raises the source voltage and thereby reduces the gate-to-source voltage thus "pinching off" the channel of the MOSFET until it reaches a balance point with the other channels.

FIG. 1 is a schematic diagram showing multiple MOSFET SSPC 10, which controls the supply of current power bus 12 to load 14. SSPC 10 includes controller 16, driver 18, a plurality of parallel current supply paths 20A-20N, current sense resistor 22, Zener diode 24, blocking diode 26, and resistors 28, 30, and 32. Each current supply path 20A-20N includes main power switching FET 34 and balance circuit 36, which includes secondary FET 38 and balance resistor 40.

SSPC 10 provides electrical current from power bus 12 to load 14. The current is divided among parallel current paths 20A-20N. The more current paths provided, the larger the total current capacity of SSPC 10.

Load 14 may be an inductive load. In other words, load 14 can have an impedance that includes an inductive component. As a result, when the SSPC turns off, the inductance within load 14 has stored energy in the form of magnetic flux. Load 14 will resist a change in the current flow when turn-off occurs, and will exhibit a voltage reversal. If power bus 12 is a DC bus with a positive voltage, load 14 will exhibit a negative going voltage during turn-off of current paths 20A-20N.

The operation of current paths 20A-20N is controlled by controller 16 based upon command signals that determine whether load 14 should be on or off, as well as a current sense feedback signal that represents the voltage across current sense resistor 22. The output of controller 16 is provided to driver 18, which provides FET control signals to main power switching FETs 34 and secondary FETs 38 of current paths 20A-20N. The output of driver 18 is supplied to the gates of main power switching FETs 34 through resistor 28 and resistors 30. The output driver 18 is also supplied to the gates of FETs 38 through resistors 32. Zener diode 24 and blocking diode 26 are connected between power bus 12 and resistors 30 to limit source-drain voltage by forcing FETs 34 on as needed through resistors 30.

The output of driver 18 simultaneously turns on main power switching FETs 34 and secondary FETs 38. As a result, when main power switching FETs 34 are turned on, balance resistors 40 are shunted by secondary FETs 38. FET 38 is a low voltage ultra-low ON-resistance FET that is turned on whenever main power switching FET 34 is on.

When FETs 34 and 38 are turned on, they are in the fully saturated operating mode, thus the voltage drop across FET 34 is determined by Rds-ON of FET 34. The voltage across balancing circuit 36 when FET 38 is on is based upon Rds-ON of FET 38. In other words, balance resistor 40 is shunted by secondary FET 38 when current paths 20A-20N are on and power is being provided to load 14.

During turn-off, the drive signal from driver 18 goes low, and therefore the voltage and the gates of main FETs 34 and secondary FETs 38 go low. As a result, secondary FETs 38 turn-off, which introduce balance resistors 40 into current paths 20A-20N.

The gate-to-source threshold voltages of main FETs 34 can differ significantly. Differences in threshold voltage can be as much as 2 volts at room temperature from FET to FET. If one of main power switching FETs 34 turns on before the rest of the FETs 34 as a result of load 14 pulling the source voltage of FET 34 down a very large amount of power can be applied to the one main FET 34 that is turned on and damage to that FET can occur.

Balancing circuits 36 counteract the unbalance in current distribution caused by differences in gate-to-source threshold voltages in main FETs 34. During turn-off, balancing resistors 40 force more source voltage on those FETs that are carrying more current. The larger the current flow through balancing resistor 40, the higher the voltage in the upper end of balancing resistor 40, which is connected to the source of main FET 34. The added voltage provided by the voltage drop across balance resistor 40 modulates the source voltage of main FET 34 to counteract current unbalance caused by threshold voltage differences. In other words, balancing resistors 40 help to pinch off the channel between drain and source of main power switching FET 34 to reduce the current flow through FET 34. As a result, a balancing of current among current carry channels 20A-20N is produced by the insertion of balancing resistors 40 in series with main power switching FETs 34 during turn-off.

Figure 2:
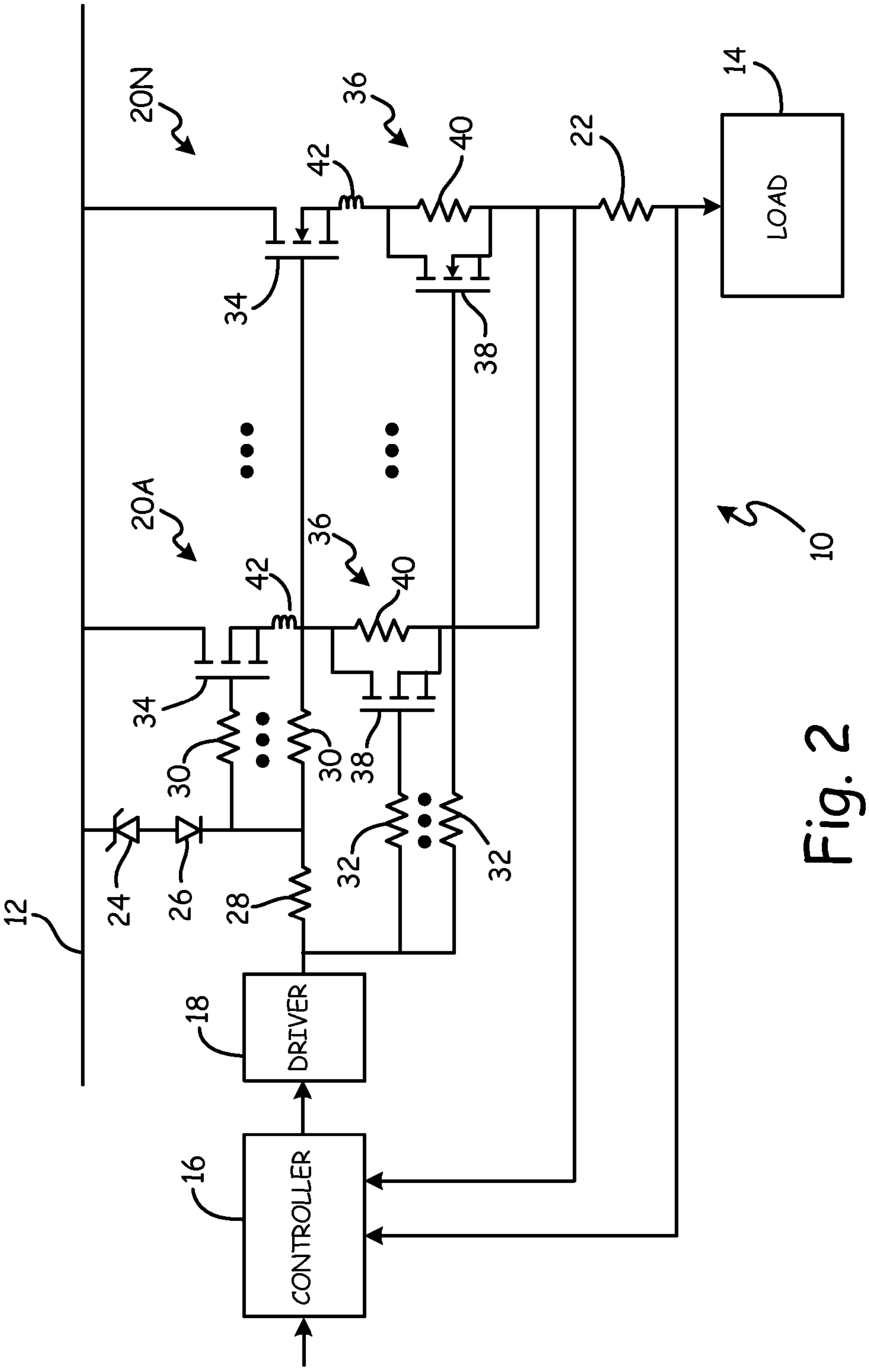
FIG. 2 is a schematic diagram of another embodiment of a solid state power controller using parallel current supply paths and balancing circuitry to balance current flow during turn-off.

An improvement in leading edge switching power can be accomplished by adding a small inductor in series with the source of main switching FET 34. FIG. 2 shows SSPC 10A, which is similar to SSPC 10 of FIG. 1 except for the addition of small inductor 42 in series between the source of main FET 34 and balancing circuit 36 in each current path 20A-20N. Current can rise very rapidly on a fault induced turn-off, and inductors 42 can provide some time for secondary FETs 38 to turn-off so that balance resistor 40 takes over. This avoids a very short, high current/power narrow pulse in the time in which main power switching FETs 34 are not sharing current well.

In FIG. 1 and FIG. 2, SSPC 10 and SSPC 10A have been described in the context of a power distribution system using a DC power bus. The balancing circuitry shown in FIG. 1 and FIG. 2 can also be used in SSPC applications where power is being delivered from an AC power bus. In those application, current paths will be provided for both positive half cycle and negative half cycle of the negative AC power. Furthermore, although MOSFETs have been described and shown in FIGS. 1 and 2, other types of FETs or other devices could be used.

Figure 3:
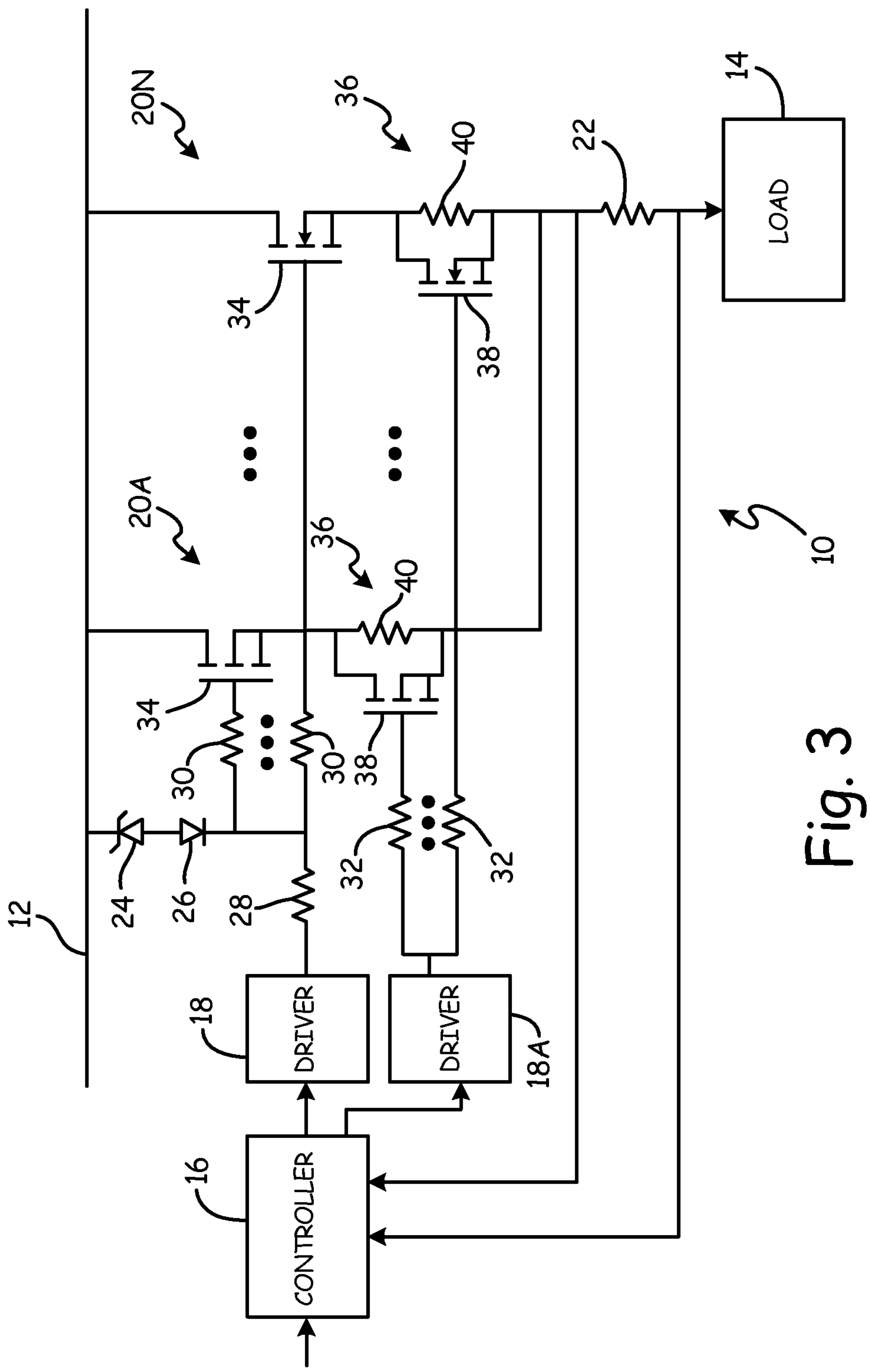
FIG. 3 is a schematic diagram of another embodiment of a solid state power controller using parallel current supply paths and balancing circuitry to balance current flow during turn-off, in which turn-on of secondary FETs is delayed with respect to turn-on of main power switching FETs.

It is also useful to note that if a small delay is added on the turn-on of MOSFETs 38 when the SSPC is first turned on then this same balance resistor method can also help protect the sharing of the MOSFETs 34 when supplying inrush current to capacitive loads. The operation of the protection mechanism is very much the same as it is for when the SSPC is turned OFF into an inductive load. This delay can be accomplished by the controller with separate driver 18A for FET's 38 (as shown in FIG. 3) or by a non-linear drive instead of resistors 32 from the driver to FET's 38 or by other signal delays means.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A solid state power controller (SSPC) for controlling flow of current from a power bus to a load, the SSPC comprising:

a plurality of current supply paths connected in parallel to control current flow between the power bus and the load, each current supply path comprising:

a main power switching FET;

a balance resistor connected in the current supply path in series between the main power switching FET and the load to modulate gate-to-source voltage of the main power switching FET as a function of current flowing through the balance resistor; and a secondary FET, connected in parallel with the balance resistor, that shunts the balance resistor to prevent modulation of the source voltage of the main power switching FET when the main power switching FET and the secondary FET are turned on, and allows current flow through the balance resistor to allow modulation of the source voltage of the main power switching FET during a turn-off time of the main power switching FET, so that unbalance in current distribution among the plurality of parallel current supply paths during turn-off caused by differences in gate-to-source threshold voltage of the main power switching FETs is counteracted by the modulation of the gate-to-source voltages by the balance resistors; and a controller that provides turn-on and turn-off signals to the main power switching FETs and the secondary FETs.

2. The SSPC of claim 1 and further comprising:

a current sensing resistor connected between the plurality of current supply paths and the load.

3. The SSPC of claim 2, wherein the controller provides the turn-off signals as a function of current flow through the current sensing resistor.

4. The SSPC of claim 1 wherein the main power switching FETs and the secondary FETs are MOSFETs.

5. The SSPC of claim 1 wherein the balance resistor is connected to the source of the main power switching FET so that an increase in voltage across the balance resistor increases source voltage of the main power switching FET during turn-off to cause gate-to-source voltage of the main power switching FET to decrease and current flow through the main power switching FET to decrease.

6. The SSPC of claim 1 wherein each current supply path further comprises an inductor connected between the main power switching FET and the balance resistor.

7. The SSPC of claim 1 wherein the controller is configured to provide turn-on signals to gates of the main power switching FETs to cause the main power switching FETs operate in a fully ON saturated state, and is configured to provide turn-off signals to the gates of main power switching FETs to cause the main power switching FETs to operate during turn-off in a linear region with current flow through the main power switching FETs and voltage across source to drain of the main power switching FETs until energy inductively stored in the load is dissipated.

8. The SSPC of claim 1, wherein the controller is configured to provide turn-on signals to gates of the secondary FETs that are delayed with respect to the turn-on signals provided by the controller to gates of the main power switching FETs.

9. A method of controlling current flow from a power bus to an inductive load, the method comprising;

supplying current through a plurality of parallel current supply paths from the power bus to the inductive load;

providing a turn-off signal to a main power switching FET in each of the current supply paths, each main power switching FET having a gate, a drain, and a source;

in response to the turn-off signal, introducing into each of the current supply paths, a balance resistor connected in series between the source of the main power switching FET and the load to modulate gate-to-source voltage of the main power switching FET in that current supply path as a function of current flow through the balance resistor, so that unbalance in current distribution among the parallel current supply paths during turn-off caused by differences in gate-to-source threshold voltages of the main power switching FETs is counteracted.

10. The method of claim 9 and further comprising:

shunting the balance resistor in each current supply path with a secondary FET that is turned on when the main power switching FET is turned on.

11. The method of claim 10, wherein introducing the balance resistor comprises:

turning off the secondary FET in response to the turn-off signal.

12. The method of claim 11 and further comprising:

delaying turn-on of the secondary FET with respect to turn-on of the main power switching FET.

13. The method of claim 9, wherein each current supply path includes an inductor between the main power switching FET and the balance resistor.

14. The method of claim 9, wherein the main power switching FETs operate in a fully ON saturated state while supplying current though the parallel current supply paths prior to receiving the turn-off signal, and operate in a linear region after receiving the turn-off signal until energy inductively stored in the inductive load is dissipated.

15. A solid state power controller (SSPC) for controlling flow of current from a power bus to a load, the SSPC comprising:

- a plurality of current supply paths connected in parallel to control current flow between the power bus and the load, each current supply path comprising:
  - a main power switching FET;
  - a balance resistor connected in the current supply path between the main power switching FET and the load;
  - a secondary FET that shunts the balance resistor when the main power switching FET and the secondary FET are turned on, and allows current flow through the balance resistor during a turn-off time of the main power switching FET;
  - a current sensing resistor connected between the plurality of current supply paths and the load; and
- a controller that provides turn-on and turn-off signals to the main power switching FETs and the secondary FETs, wherein the controller provides the turn-off signals as a function of current flow through the current sensing resistor.

16. A solid state power controller (SSPC) for controlling flow of current from a power bus to a load, the SSPC comprising:

- a plurality of current supply paths connected in parallel to control current flow between the power bus and the load, each current supply path comprising:
  - a main power switching FET;
  - a balance resistor connected in the current supply path between the main power switching FET and the load;
  - an inductor connected between the main power switching FET and the balance resistor; and
  - a secondary FET that shunts the balance resistor when the main power switching FET and the secondary FET are turned on, and allows current flow through the balance resistor during a turn-off time of the main power switching FET; and
- a controller that provides turn-on and turn-off signals to the main power switching FETs and the secondary FETs.

17. A method of controlling current flow from a power bus to an inductive load, the method comprising;

- supplying current through a plurality of parallel current supply paths from the power bus to the inductive load;
- providing a turn-off signal to a main power switching FET in each of the current supply paths;
- in response to the turn-off signal, introducing into each of the current supply paths, a balance resistor to modulate gate-to-source voltage of the main power switching FET in that current supply path as a function of current flow through the balance resistor, wherein introducing the balance resistor comprises turning off a secondary FET in response to the turn-off signal;
- shunting the balance resistor in each current supply path with the secondary FET which is turned on when the main power switching FET is turned on; and
- delaying turn-on of the secondary FET with respect to turn-on of the main power switching FET.

18. A method of controlling current flow from a power bus to an inductive load, the method comprising;

- supplying current through a plurality of parallel current supply paths from the power bus to the inductive load;
- providing a turn-off signal to a main power switching FET in each of the current supply paths;
- in response to the turn-off signal, introducing into each of the current supply paths, a balance resistor to modulate gate-to-source voltage of the main power switching FET in that current supply path as a function of current flow through the balance resistor; and
- wherein each current supply path includes an inductor between the main power switching FET and the balance resistor.

19. A method of controlling current flow from a power bus to an inductive load, the method comprising;

- supplying current through a plurality of parallel current supply paths from the power bus to the inductive load;
- providing a turn-off signal to a main power switching FET in each of the current supply paths;
- in response to the turn-off signal, introducing into each of the current supply paths, a balance resistor to modulate gate-to-source voltage of the main power switching FET in that current supply path as a function of current flow through the balance resistor; and
- wherein the main power switching FETs operate in a fully ON saturated state while supplying current though the parallel current supply paths prior to receiving the turn-off signal, and operate in a linear region after receiving the turn-off signal until energy inductively stored in the inductive load is dissipated.

* * * * *